(12) United States Patent
Cai et al.

(10) Patent No.: US 12,396,221 B2
(45) Date of Patent: Aug. 19, 2025

(54) JUNCTION FIELD-EFFECT TRANSISTORS

(71) Applicant: GlobalFoundries Singapore Pte. Ltd., Singapore (SG)

(72) Inventors: Xinshu Cai, Singapore (SG); Shyue Seng Tan, Singapore (SG); Vibhor Jain, Essex Junction, VT (US); John J. Pekarik, Underhill, VT (US)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 338 days.

(21) Appl. No.: 17/969,768

(22) Filed: Oct. 20, 2022

(65) Prior Publication Data
US 2024/0136395 A1 Apr. 25, 2024
US 2024/0234498 A9 Jul. 11, 2024

(51) Int. Cl.
 *H10D 62/10* (2025.01)
 *H10D 30/65* (2025.01)
 *H10D 62/13* (2025.01)

(52) U.S. Cl.
 CPC ......... *H10D 62/116* (2025.01); *H10D 30/658* (2025.01); *H10D 62/151* (2025.01)

(58) Field of Classification Search
 CPC ............ H01L 29/0653; H01L 29/0847; H01L 29/7825; H01L 29/0649; H01L 29/1066; H01L 29/808; H10D 30/658; H10D 62/116; H10D 62/151
 See application file for complete search history.

(56) References Cited

U.S. PATENT DOCUMENTS

| | | | | |
|---|---|---|---|---|
| 4,233,615 A * | 11/1980 | Takemoto | ............ | H01L 29/808 257/539 |
| 4,322,738 A * | 3/1982 | Bell | ...................... | H01L 29/808 257/E29.05 |
| 5,639,688 A * | 6/1997 | Delgado | ............. | H01L 29/7833 257/E21.375 |
| 6,307,223 B1 * | 10/2001 | Yu | .......................... | H01L 29/808 257/256 |
| 2007/0096144 A1 * | 5/2007 | Kapoor | ................. | H01L 27/098 257/256 |
| 2008/0272408 A1 * | 11/2008 | Vora | ..................... | H01L 29/1066 438/653 |
| 2009/0101941 A1 * | 4/2009 | Ellis-Monaghan | .... | H10D 30/83 257/E21.446 |

(Continued)

OTHER PUBLICATIONS

Shin, Hyun J., et al., "A High-Speed Low-Power JFET Pull-Down ECL Circuit," IEEE Journal of Solid-State Circuits, vol. 26 (4), pp. 679-683 (Year: 1991).*

(Continued)

*Primary Examiner* — Fernando L Toledo
*Assistant Examiner* — Ryan T. Fortin
(74) *Attorney, Agent, or Firm* — Thompson Hine LLP; Francois Pagette

(57) ABSTRACT

Structures for a junction field-effect transistor and methods of forming a structure for a junction field-effect transistor. The structure comprises a first gate on a top surface of a semiconductor substrate, a second gate beneath the top surface of the semiconductor substrate, and a channel region in the semiconductor substrate. The first gate is positioned between a source and a drain, and the channel region positioned between the first gate and the second gate.

19 Claims, 3 Drawing Sheets

(56) References Cited

U.S. PATENT DOCUMENTS

2013/0307074 A1* 11/2013 Cheng ................... H01L 28/20
257/E21.409
2014/0235021 A1    8/2014 Liu et al.
2021/0091236 A1* 3/2021 Liu ................... H10D 30/0323

OTHER PUBLICATIONS

Dentan, M., et al., "Study of a CMOS-JFET-Bipolar Radiation Hard Analog-Digital Technology Suitable for High Energy Physics Electronics", IEEE Transactions on Nuclear Science, vol. 40 (6), pp. 1555-1560 (Year: 1993).*

Shi, Yun, et al., "Cost-Competitive High Performance Junction-FET (JFET) in CMOS Process for RF & Analog Applications", 2010 IEEE Radio Frequency Integrated Circuits Symposium, pp. 237-240 (Year: 2010).*

Fleischer, Daniel A., et al., "CMOS-Integrated Low-Noise Junction Field-Effect Transistors for Bioelectronic Applications", IEEE Electron Device Letters, vol. 39 (7), pp. 931-934 (Year: 2018).*

Y. Shi, R. M. Rassel, R. A. Phelps, B. Rainey, J. Dunn and D. Harame, "Design and optimization of silicon JFET in 180nm RF/BiCMOS technology," 2010 IEEE Bipolar/BiCMOS Circuits and Technology Meeting (BCTM), 2010, pp. 86-89, doi: 10.1109/BIPOL.2010.5667942.

L. Sturm-Rogon, K. Neumeier and C. Kutter, "Low-Noise Si-JFETs Enhanced by Split-Channel Concept," in IEEE Transactions on Electron Devices, vol. 67, No. 11, pp. 4789-4793, Nov. 2020, doi: 10.1109/TED.2020.3026661.

* cited by examiner

JUNCTION FIELD-EFFECT TRANSISTORS

BACKGROUND

The disclosure relates to semiconductor devices and integrated circuit manufacture and, more specifically, to structures for a junction field-effect transistor and methods of forming a structure for a junction field-effect transistor.

High-performance radio-frequency applications may rely on integrated circuits fabricated by a BiCMOS process that combines the formation of bipolar junction transistors with the formation of complementary metal-oxide-semiconductor (CMOS) devices. A bipolar junction transistor is a multi-terminal electronic device that includes an emitter, a collector, and an intrinsic base arranged between the emitter and collector. A field-effect transistor is a type of CMOS device that includes a source, a drain, a semiconductor body supplying a channel region between the source and drain, and a gate electrode overlapped with the channel region.

A junction field-effect transistor is a three-terminal complementary metal-oxide-semiconductor device that can be used as a voltage-controlled switch in a BiCMOS integrated circuit. However, the conventional integration of a junction field-effect transistor into a BiCMOS process requires extra masks and implantation steps. In general, junction field-effect transistors that are conventionally integrated into a BiCMOS process may suffer from excessively-high off-voltages and/or excessively-high on-resistances.

Improved structures for a junction field-effect transistor and methods of forming a structure for a junction field-effect transistor are needed.

SUMMARY

In an embodiment, a structure for a junction field-effect transistor is provided. The structure comprises a first gate on a top surface of a semiconductor substrate, a second gate beneath the top surface of the semiconductor substrate, and a channel region in the semiconductor substrate. The first gate is positioned between a source and a drain, and the channel region positioned between the first gate and the second gate.

In an embodiment, a method of forming a structure for a junction field-effect transistor is provided. The method comprises forming a first gate on a top surface of a semiconductor substrate, forming a second gate beneath the top surface of the semiconductor substrate, and forming a channel region in the semiconductor substrate. The first gate is positioned between a source and a drain, and the channel region positioned between the first gate and the second gate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
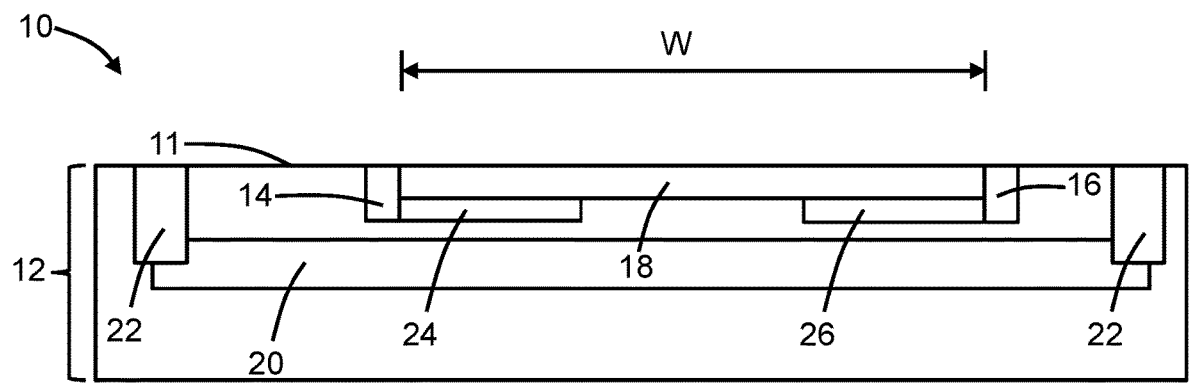
FIGS. 1-3 are cross-sectional views of a structure at successive fabrication stages of a processing method in accordance with embodiments of the invention.

With reference to FIG. 1 and in accordance with embodiments of the invention, a structure 10 for a junction field-effect transistor includes a semiconductor substrate 12 that may be comprised of a semiconductor material, such as single-crystal silicon. The semiconductor substrate 12 may be initially doped, before subsequent processing, to have, for example, p-type conductivity. Shallow trench isolation regions 14, 16 are arranged in different portions of the semiconductor substrate 12. The shallow trench isolation regions 14, 16 may be formed by patterning shallow trenches in the semiconductor substrate 12 with lithography and etching processes, depositing a dielectric material, such as silicon dioxide, in the shallow trenches, and planarizing and/or recessing the deposited dielectric material.

A well 18 is positioned in the semiconductor substrate 12. In an embodiment, the well 18 may be doped with a concentration of an n-type dopant (e.g., arsenic or phosphorus) to provide n-type conductivity. The well 18, which may adjoin a top surface 11 of the semiconductor substrate 12, may extend in a vertical direction to a depth that is shallower than the depth of the shallow trench isolation regions 14, 16. The well 18 may extend in a lateral direction from the shallow trench isolation region 14 to the shallow trench isolation region 16. In an embodiment, the well 18 may adjoin the shallow trench isolation region 14. In an embodiment, the well 18 may adjoin the shallow trench isolation region 16. In an embodiment, the well 18 may adjoin the shallow trench isolation region 14 and may also adjoin the shallow trench isolation region 16. In an embodiment, the well 18 may have a width W equal to the separation between the shallow trench isolation region 14 and the shallow trench isolation region 16. The well 18 may define a channel region of the junction field-effect transistor.

The well 18 may be formed by introducing a dopant by, for example, ion implantation into the semiconductor substrate 12. A patterned implantation mask may be formed to define a selected area on the top surface 11 of the semiconductor substrate 12 that is exposed for the implantation of ions. The implantation mask may include a layer of an organic photoresist that is applied and patterned to form an opening exposing the selected area on the top surface 11 of the semiconductor substrate 12 and determining, at least in part, the location and horizontal dimensions of the well 18. The implantation mask has a thickness and stopping power sufficient to block the implantation of ions in masked areas. The implantation conditions (e.g., ion species, dose, kinetic energy) may be selected to tune the electrical and physical characteristics of the well 18.

A well 20 is positioned in the semiconductor substrate 12. The well 20 may be located in a vertical direction at a depth that is greater than the depth of the shallow trench isolation regions 14, 16. The well 18 may be positioned in a vertical direction between the well 20 and the top surface 11 of the semiconductor substrate 12. The well 20 may have the same conductivity type as the semiconductor substrate 12 but at a higher dopant concentration. In an embodiment, the well 20 may be doped with a concentration of a p-type dopant (e.g., boron) to provide p-type conductivity. The well 20 may define a bottom gate of the junction field-effect transistor, and the bottom gate may be positioned beneath the top surface 11 of the semiconductor substrate 12.

The well 20 may be formed by introducing a dopant by, for example, ion implantation into the semiconductor substrate 12. A patterned implantation mask may be formed to define a selected area on the top surface 11 of the semiconductor substrate 12 that is exposed for the implantation of ions. The implantation mask may include a layer of an organic photoresist that is applied and patterned to form an opening exposing the selected area on the top surface 11 of the semiconductor substrate 12 and determining, at least in part, the location and horizontal dimensions of the well 20. The implantation mask has a thickness and stopping power sufficient to block the implantation of ions in masked areas. The implantation conditions (e.g., ion species, dose, kinetic energy) may be selected to tune the electrical and physical characteristics of the well 20.

The well 20 may be connected to pick-up regions 22 of the same conductivity type. The pick-up regions 22 may extend from the well 20 to the top surface 11 of the semiconductor substrate 12 outside of the shallow trench isolation regions 14, 16. The pick-up regions 22 may be, for example, formed concurrently with the formation of transistor sources and drains in a BiCMOS process flow.

A doped region 24 is positioned in the semiconductor substrate 12 adjacent to the shallow trench isolation region 14 and beneath the well 18. The doped region 24 may extend from the shallow trench isolation region 14 laterally beneath a portion of the well 18. The doped region 24 is located in a vertical direction between the well 20 and the well 18. The doped region 24 may be doped to have an opposite conductivity type from the well 18. In an embodiment, the doped region 24 may be doped with a concentration of a p-type dopant (e.g., boron) to provide p-type conductivity. In an embodiment, the doped region 24 may adjoin the well 18. In an embodiment, a portion of the well 18 may overlap with the doped region 24. The doped region 24 may participate with the well 18 in defining a split channel of the junction field-effect transistor.

The doped region 24 may be formed by introducing a dopant by, for example, ion implantation into the semiconductor substrate 12. A patterned implantation mask may be formed to define a selected area on the top surface 11 of the semiconductor substrate 12 that is exposed for the implantation of ions. The implantation mask may include a layer of an organic photoresist that is applied and patterned to form an opening exposing the selected area on the top surface 11 of the semiconductor substrate 12 and determining, at least in part, the location and horizontal dimensions of the doped region 24. The implantation mask has a thickness and stopping power sufficient to block the implantation of ions in masked areas. The implantation conditions (e.g., ion species, dose, kinetic energy) may be selected to tune the electrical and physical characteristics of the doped region 24.

A doped region 26 is positioned in the semiconductor substrate 12 adjacent to the shallow trench isolation region 16 and beneath the well 18. The doped region 26 extend from the shallow trench isolation region 16 laterally beneath a portion of the well 18 and is laterally spaced from the doped region 24. The doped region 26 is located in a vertical direction between the well 20 and the well 18. In an embodiment, the doped region 26 may adjoin the well 18. In an embodiment, a portion of the well 18 may overlap with the doped region 26. The doped region 26 may be doped to have the same conductivity type as the well 18. In an embodiment, the doped region 26 may be doped with a concentration of an n-type dopant (e.g., arsenic or phosphorus) to provide n-type conductivity. The doped region 26 may participate with the well 18 in defining a split channel region of the junction field-effect transistor.

The doped region 26 may be formed by introducing a dopant by, for example, ion implantation into the semiconductor substrate 12. A patterned implantation mask may be formed to define a selected area on the top surface 11 of the semiconductor substrate 12 that is exposed for the implantation of ions. The implantation mask may include a layer of an organic photoresist that is applied and patterned to form an opening exposing the selected area on the top surface 11 of the semiconductor substrate 12 and determining, at least in part, the location and horizontal dimensions of the doped region 26. The implantation mask has a thickness and stopping power sufficient to block the implantation of ions in masked areas. The implantation conditions (e.g., ion species, dose, kinetic energy) may be selected to tune the electrical and physical characteristics of the doped region 26.

In an alternative embodiment, the doped region 26 may be omitted from the structure 10. As a result, the split channel of the junction field-effect transistor is asymmetric with only the doped region 24 present.

Figure 2:
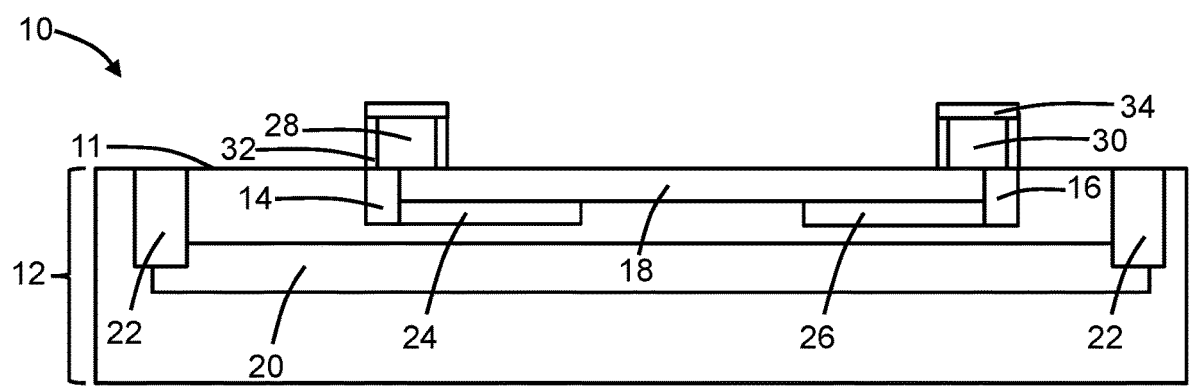

With reference to FIG. 2 in which like reference numerals refer to like features in FIG. 1 and at a subsequent fabrication stage, raised semiconductor layers 28, 30 may be formed on the respective sections of the semiconductor substrate 12 over the well 18. The raised semiconductor layer 28 may overlap with the shallow trench isolation region 14, a portion of the doped region 24 adjacent to the shallow trench isolation region 14, and a portion of the well 18 between the portion of the doped region 24 and the top surface 11. The raised semiconductor layer 30 may overlap with the shallow trench isolation region 16, a portion of the doped region 26 adjacent to the shallow trench isolation region 16, and a portion of the well 18 between the doped region 26 and the top surface 11.

The raised semiconductor layers 28, 30 may be formed by depositing a layer comprised of a semiconductor material and patterning the layer with lithography and etching processes. In an embodiment, the semiconductor material of the raised semiconductor layers 28, 30 may be doped to have the same conductivity type as the well 18. In an embodiment, the semiconductor material of the raised semiconductor layers 28, 30 may be doped with a concentration of an n-type dopant (e.g., phosphorus or arsenic) that provides n-type conductivity. The raised semiconductor layers 28, 30 may define a source and a drain of the junction field-effect transistor, and the source and drain may be located on the top surface 11 of the semiconductor substrate 12.

Spacers 32 may be positioned on the sidewalls of each of the raised semiconductor layers 28, 30. The spacers 32 may be formed by depositing a layer comprised of a dielectric material, such as silicon nitride, that is an electrical insulator and etching the deposited layer with an anisotropic etching process. Caps 34, which be sections of a hardmask used to pattern the raised semiconductor layers 28, 30, may be positioned on the top surface of each of the raised semiconductor layers 28, 30. The caps 34 may be comprised of a dielectric material, such as silicon nitride, that is an electrical insulator.

Figure 3:
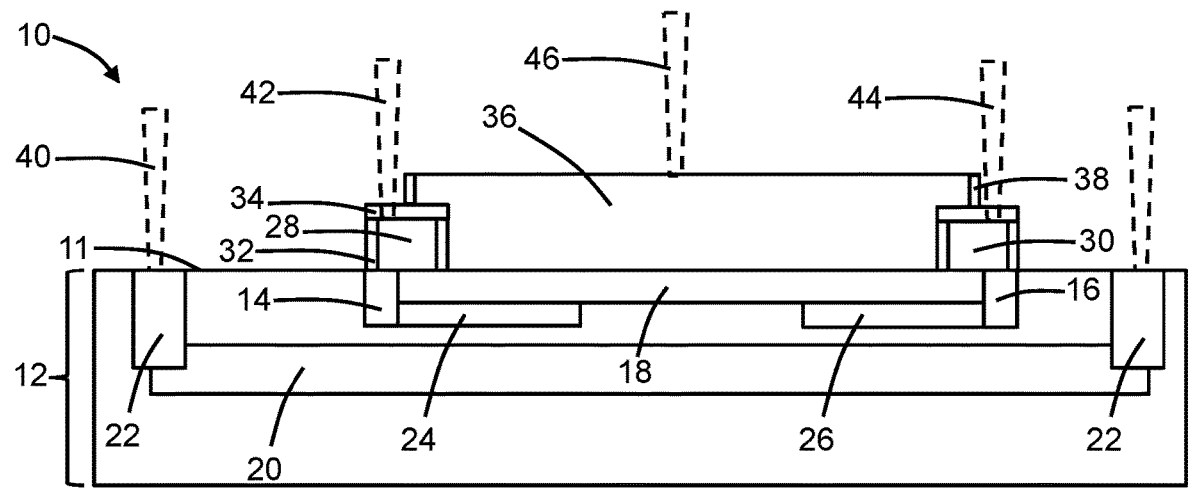

With reference to FIG. 3 in which like reference numerals refer to like features in FIG. 2 and at a subsequent fabrication stage, a semiconductor layer 36 is formed on a section of the semiconductor substrate 12 over the well 18. The semiconductor layer 36, which is positioned in a lateral direction between the raised semiconductor layer 28 and the raised semiconductor layer 30, overlaps with a portion of the well 18 between the raised semiconductor layer 28 and the raised semiconductor layer 30. The semiconductor layer 36 may overlap with the raised semiconductor layers 28, 30 and also overlap with respective portions of the doped regions 24, 26 that are not overlapped by the raised semiconductor layers 28, 30.

The semiconductor layer 36 may be formed by depositing a layer comprised of a semiconductor material and patterning the layer with lithography and etching processes. In an embodiment, the semiconductor material of the semiconductor layer 36 may be doped to have an opposite conductivity type from the well 18 and the raised semiconductor layers 28, 30. In an embodiment, the semiconductor material of the raised semiconductor layers 28, 30 may be doped with a concentration of a p-type dopant (e.g., boron) that provides p-type conductivity. The semiconductor layer 36 may define a top gate of the junction field-effect transistor, and the top gate may be located on the top surface 11 of the semiconductor substrate 12.

The spacers 32 and the caps 34 are arranged between the semiconductor layer 36 and the raised semiconductor layers 28, 30. The dielectric materials of the spacers 32 and the caps 34 function to electrically isolate the semiconductor layer 36 from the raised semiconductor layers 28, 30. The semiconductor layer 36 defines a p-n junction along an interface at the top surface 11 of the semiconductor substrate 12 with the well 18.

Spacers 38 may be positioned on the sidewalls of the semiconductor layer 36. The spacers 38 may be formed by depositing a layer comprised of a dielectric material, such as silicon nitride, and etching the deposited layer with an anisotropic etching process.

Middle-of-line processing and back-end-of-line processing follow, which includes formation of an interconnect structure with electrical connections coupled to the junction field-effect transistor. Electrical connections 40 may be coupled by the pick-up regions 22 to the well 20 providing the bottom gate of the junction field-effect transistor. Electrical connections 42, 44, 46 may be coupled to the semiconductor layer 36 providing the top gate of the junction field-effect transistor and to the raised semiconductor layers 28, 30 providing the source and the drain of the junction field-effect transistor.

The junction field-effect transistor embodied in the structure 10 may be integrated into a BiCMOS process without the necessity of added masks. For example, the formation of the semiconductor layer 36 defining one of the gates of the structure 10 may be shared with the formation of the emitter of a vertical PNP bipolar junction transistor. As another example, the formation of the raised semiconductor layers 28, 30 defining the source and drain of the structure 10 may be shared with the formation of the extrinsic base of a vertical PNP bipolar junction transistor. As another example, the formation of the doped region 24 participating in the split channel region of the structure 10 may be shared with the formation of the selectively-implanted collector of a vertical PNP bipolar junction transistor. As another example, the formation of the doped region 26 participating in the split channel region of the structure 10 may be shared with the formation of the selectively-implanted collector of a vertical NPN bipolar junction transistor.

The junction field-effect transistor embodied in the structure 10 may be optimized for either a lower off-voltage or lower on-resistance. The raised semiconductor layers 28, 30 defining the source and drain of the structure 10 and the dielectric material separating the raised semiconductor layers 28, 30 from the semiconductor layer 36 may promote a reduction in the on-resistance.

Figure 4:
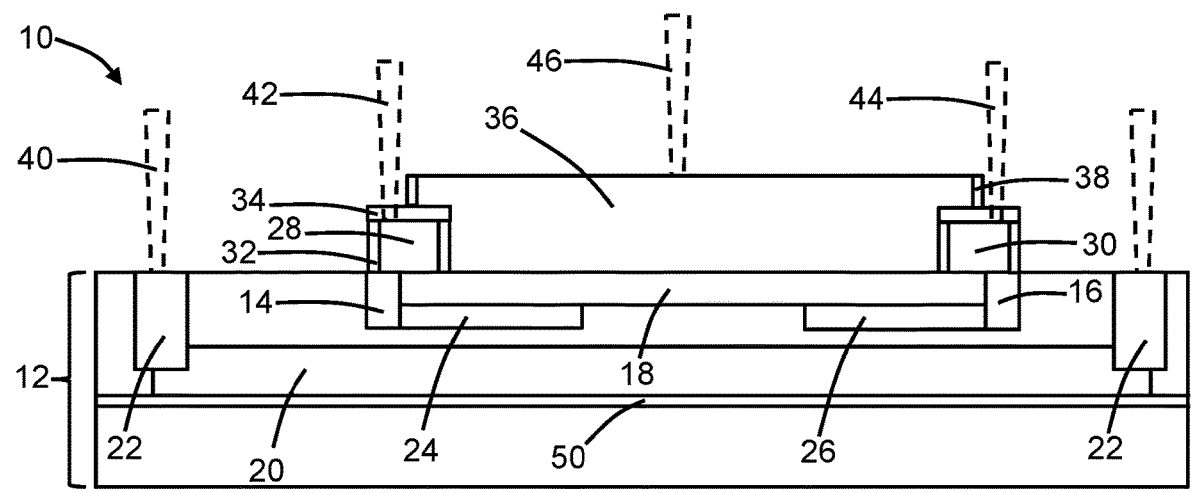
FIG. 4 is a cross-sectional view of a structure in accordance with alternative embodiments of the invention.

With reference to FIG. 4 and in accordance with alternative embodiments of the invention, a deep well 50 may be positioned in the semiconductor substrate 12. The deep well 50 may have an opposite conductivity type from the well 20. In an embodiment, the deep well 50 may be doped with a concentration of an n-type dopant (e.g., arsenic or phosphorus) to provide n-type conductivity. The deep well 50 may be formed by introducing a dopant by, for example, ion implantation into the semiconductor substrate 12. The implantation conditions (e.g., ion species, dose, kinetic energy) may be selected to tune the electrical and physical characteristics of the deep well 50. The deep well 50 may be accessible at the top surface 11 of the semiconductor substrate 12 outside of the pick-up regions 22 for establishing electrical contact. The deep well 50, which is positioned in part beneath the well 20, electrically isolates the well 20 providing the bottom gate of the junction field-effect transistor.

Figure 5:
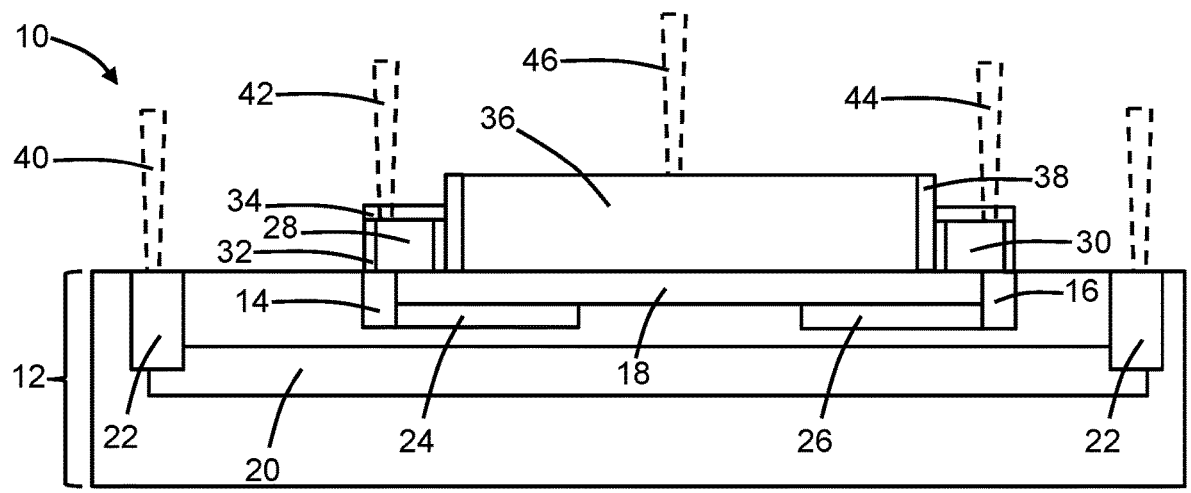
FIG. 5 is a cross-sectional view of a structure in accordance with alternative embodiments of the invention.

With reference to FIG. 5 and in accordance with alternative embodiments of the invention, the semiconductor layer 36 may be formed over the well 18 in a non-overlapping arrangement with the raised semiconductor layers 28, 30. Spacers 32 and spacers 38 are arranged as electrically-insulating separators between the semiconductor layer 36 and each of the raised semiconductor layers 28, 30.

Figure 6:
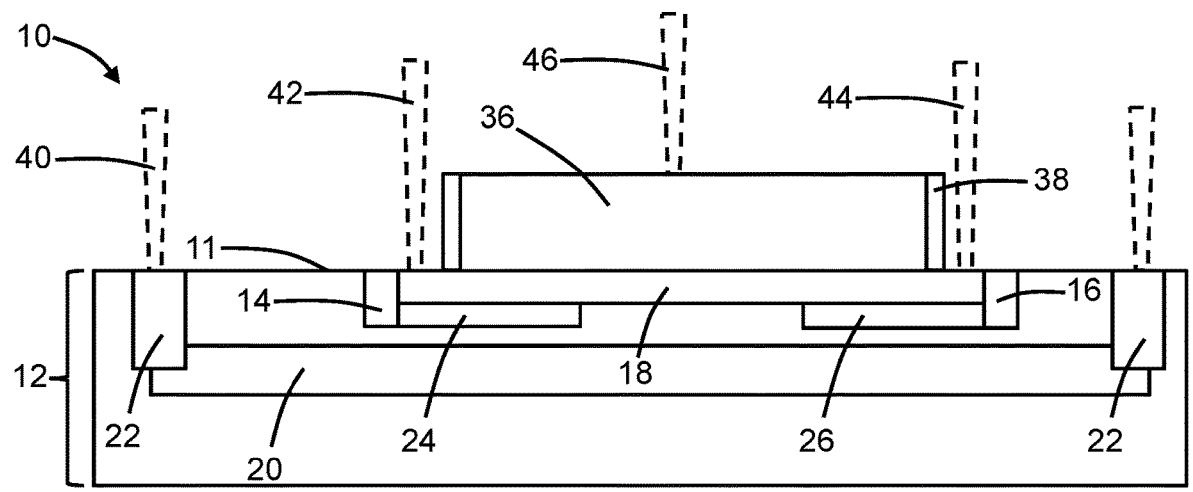
FIG. 6 is a cross-sectional view of a structure in accordance with alternative embodiments of the invention.

With reference to FIG. 6 and in accordance with alternative embodiments of the invention, the structure 10 may omit the raised semiconductor layers 28, 30 such that the electrical connections 42, 44 extend to different portions of the well 18 providing the channel region of the junction field-effect transistor. The different portions of the well 18 effectively provide the source and drain of the junction field-effect transistor. In an embodiment, the electrical connections 42, 44 may directly contact the different portions of the well 18. This alteration may be effective to reduce the parasitic capacitance between the source and drain of the junction field-effect transistor and the semiconductor layer 36 providing the top gate of the junction field-effect transistor.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a junction field-effect transistor, the structure comprising:
   a semiconductor substrate having a top surface;
   a first well in the semiconductor substrate, the first well having a first conductivity type;
   a source;
   a drain including a first semiconductor layer on the top surface of the semiconductor substrate;
   a first gate including a second semiconductor layer on the top surface of the semiconductor substrate, the first gate positioned between the source and the drain, and the second semiconductor layer overlapping with the first semiconductor layer;
   a second gate including a second well in the semiconductor substrate, the second well beneath the top surface of the semiconductor substrate, and the second well having a second conductivity type opposite to the first conductivity type;
   a channel region in the semiconductor substrate, the channel region positioned between the first gate and the second gate, and the second well positioned between the first well and the channel region; and
   a first doped region in the semiconductor substrate, the first doped region extending laterally beneath a first portion of the channel region, and the first doped region positioned between the second gate and the channel region.

2. The structure of claim 1 further comprising:
   a spacer comprised of a dielectric material, the spacer positioned between the first semiconductor layer and the second semiconductor layer.

3. The structure of claim 1 wherein the first semiconductor layer has the first conductivity type, and the second semiconductor layer has the second conductivity type.

4. The structure of claim 1 wherein the source includes a third semiconductor layer positioned on the top surface of the semiconductor substrate, and the second semiconductor layer overlaps with the third semiconductor layer.

5. The structure of claim 1 further comprising:
   a shallow trench isolation region in the semiconductor substrate,
   wherein the first semiconductor layer has a first portion that overlaps with the channel region and a second portion that overlaps with the shallow trench isolation region.

6. The structure of claim 1 wherein the first doped region has the first conductivity type, and the channel region has the second conductivity type.

7. The structure of claim 1 further comprising:
   a second doped region in the semiconductor substrate, the second doped region extending laterally beneath a second portion of the channel region.

8. The structure of claim 7 further comprising:
   a first shallow trench isolation region in the semiconductor substrate; and
   a second shallow trench isolation region in the semiconductor substrate,
   wherein the channel region extends from the first shallow trench isolation region to the second shallow trench isolation region, and the first doped region is positioned adjacent to the first shallow trench isolation region.

9. The structure of claim 8 wherein the second doped region is positioned adjacent to the second shallow trench isolation region.

10. The structure of claim 7 wherein the first doped region and the second doped region each adjoin the channel region.

11. The structure of claim 7 wherein the first doped region has the first conductivity type, and the second doped region has the second conductivity type.

12. The structure of claim 1 further comprising:
    a pick-up region in the semiconductor substrate, the pick-up region extending from the top surface of the semiconductor substrate to the second well; and
    an electrical connection coupled by the pick-up region to the second well.

13. The structure of claim 12 wherein the pick-up region has the second conductivity type.

14. The structure of claim 12 further comprising:
    a shallow trench isolation region in the semiconductor substrate,
    wherein the first semiconductor layer has a first portion that overlaps with the channel region and a second portion that overlaps with the shallow trench isolation region.

15. The structure of claim 1 wherein the second semiconductor layer overlaps with a portion of the first doped region.

16. A structure for a junction field-effect transistor, the structure comprising:
    a semiconductor substrate having a top surface;
    a first well in the semiconductor substrate, the first well having a first conductivity type;
    a source;
    a drain including a first semiconductor layer on the top surface of the semiconductor substrate;
    a first gate including a second semiconductor layer on the top surface of the semiconductor substrate, the first gate positioned between the source and the drain, and the second semiconductor layer overlapping with the first semiconductor layer;
    a second gate including a second well in the semiconductor substrate, the second well beneath the top surface of the semiconductor substrate, and the second well having a second conductivity type opposite to the first conductivity type;

a channel region in the semiconductor substrate, the channel region positioned between the first gate and the second gate, and the second well positioned between the first well and the channel region; and a first doped region in the semiconductor substrate, the first doped region extending laterally beneath a first portion of the channel region, wherein the first doped region adjoins the channel region.

17. The structure of claim 16 further comprising:

a second doped region in the semiconductor substrate, the second doped region extending laterally beneath a second portion of the channel region.

18. The structure of claim 17 wherein the second doped region adjoins the channel region.

19. A method of forming a structure for a junction field-effect transistor, the method comprising:

forming a first well in a semiconductor substrate, wherein the first well has a first conductivity type;

forming a source;

forming a drain including a first semiconductor layer on a top surface of the semiconductor substrate;

forming a first gate including a second semiconductor layer on the top surface of the semiconductor substrate, wherein the first gate is positioned between the source and the drain, and the second semiconductor layer overlaps with the first semiconductor layer;

forming a second gate including a second well in the semiconductor substrate, wherein the second well is located beneath the top surface of the semiconductor substrate, and the second well has a second conductivity type opposite to the first conductivity type;

forming a channel region in the semiconductor substrate, wherein the channel region is positioned between the first gate and the second gate, and the second well is positioned between the first well and the channel region; and forming a doped region in the semiconductor substrate, wherein the doped region extends laterally beneath a portion of the channel region, and the doped region is positioned between the second gate and the channel region.

* * * * *